United States Patent
Feng et al.

(10) Patent No.: US 11,473,427 B2
(45) Date of Patent: Oct. 18, 2022

(54) PHYSICAL SIMULATION TEST METHOD FOR DETECTING POSITION OF PONDING GOAF IN EXCAVATION

(71) Applicant: Taiyuan University of Technology, Shanxi (CN)

(72) Inventors: Guorui Feng, Shanxi (CN); Jiaqing Cui, Shanxi (CN); Haina Jiang, Shanxi (CN); Zhen Li, Shanxi (CN); Cheng Song, Shanxi (CN); Xiong Shen, Shanxi (CN); Xiaohong Niu, Shanxi (CN); Shengyong Hu, Shanxi (CN); Yanna Han, Shanxi (CN)

(73) Assignee: Taiyuan University of Technology, Taiyuan (CN)

( * ) Notice: Subject to any disclaimer, the term of this patent is extended or adjusted under 35 U.S.C. 154(b) by 533 days.

(21) Appl. No.: 16/537,604

(22) Filed: Aug. 11, 2019

(65) Prior Publication Data
US 2020/0102825 A1 Apr. 2, 2020

(30) Foreign Application Priority Data
Sep. 27, 2018 (CN) .......................... 201811132893.X (51) Int. Cl.
*E21C 41/18* (2006.01)
*G06F 30/20* (2020.01)
(Continued)

(52) U.S. Cl.
CPC .............. *E21C 41/18* (2013.01); *G06F 17/18* (2013.01); *G06F 30/20* (2020.01); *G06F 30/333* (2020.01)

(58) Field of Classification Search
CPC .......... E21C 41/18; G06F 17/18; G06F 30/20; G06F 30/333; Y02A 90/30; G01V 3/10
See application file for complete search history.

(56) References Cited

U.S. PATENT DOCUMENTS

2021/0102458 A1 * 4/2021 Chang ..................... E21B 43/24

FOREIGN PATENT DOCUMENTS

| CN | 101029506 A | * | 9/2007 |
| CN | 103226732 A | * | 7/2013 |

(Continued)

OTHER PUBLICATIONS

Yu et al., Numerical Analysis of Rock Mass Stability in Goaf under the Action of Multi-Factor and Multi-Field, 20141, EJGE, pp. 6963-6976 (Year: 2014).*

*Primary Examiner* — Boris Gorney
*Assistant Examiner* — Bernard E Cothran (57) ABSTRACT

A physical simulation test method for detecting a position of a ponding goaf in the excavation, which relates to physical detection of mines. This method includes: fabricating an experimental model of a composition similar to that of an excavating tunnel; fabricating a transient transmitting coil and receiving coil; connecting the coil to a wire and placing them in model A; connecting the coil to a transient electromagnetometer; injecting water into a trapezoidal goaf through a pre-buried plastic pipe; after the goaf is filled with water, immediately switching the transient electromagnetometer on to collect data; respectively transferring the coil to models B, C and D, injecting water and switching on the transient electromagnetometer to collect data; statistically analyzing detection and imaging results of the four models; and comparing the detection results with the actual data to determine detection accuracy and correction coefficient.

5 Claims, 9 Drawing Sheets

(51) Int. Cl.
*G06F 17/18* (2006.01)
*G06F 30/333* (2020.01)

(56) References Cited

FOREIGN PATENT DOCUMENTS

| | | | | |
|---|---|---|---|---|
| CN | 103256073 A | * | 8/2013 | ............ E21C 39/00 |
| CN | 105137031 A | * | 12/2015 | |
| CN | 105388265 A | * | 3/2016 | |
| CN | 105719551 A | | 6/2016 | |
| CN | 105866855 A | * | 8/2016 | |
| CN | 106405045 A | | 2/2017 | |
| CN | 108107185 A | * | 6/2018 | ............ G01N 33/18 |
| CN | 108922293 A | * | 11/2018 | ............ G09B 25/00 |
| CN | 108922293 A | | 11/2018 | |
| CN | 109164104 A | | 1/2019 | |

* cited by examiner

PHYSICAL SIMULATION TEST METHOD FOR DETECTING POSITION OF PONDING GOAF IN EXCAVATION

CROSS-REFERENCE TO RELATED APPLICATIONS

This application claims the benefit of priority from Chinese patent application No. 201811132893.X, filed on Sep. 27, 2018. The content of the aforementioned application, including any intervening amendments thereto, are incorporated herein by reference.

TECHNICAL FIELD

This application relates to physical detection of mines, and more specifically to a physical simulation test method for detecting a position of a ponding goaf in the excavation.

BACKGROUND

Water inrush is the most dangerous accident during the excavation of a coal mine, because the sudden escape of a large amount of accumulated water will threaten the safety of the staff and cause great damage to the production equipment on the working surface. While due to the difficulty in detection, the accumulated water in the goaf has been the main cause of water inrush during the excavation. The water inrush caused by the accumulated water in goaf involves the characteristics such as considerable amount of water, strong unpredictability and extremely serious destructiveness and corrosivity, and may even result in the submergence of the entire mine in some serious cases. According to the statistics of various coal mine accidents, the casualties caused by water damage are second only to those caused by gas accidents and the water damage causes the most direct economic losses. In addition, more than 80% of the water damages are caused by the accumulation of water in the goaf. Therefore, it is necessary to employ a geophysical method to find out the position of the accumulated water concealed in the goaf in advance during the excavation so as to take the preventive measures in time.

Given the characteristic that great changes will occur to the electrical properties of the stratum after the water is accumulated in the goaf, the transient electromagnetic method is more effective and involves simple operation and wide application in the detection of the accumulated water in the goaf in the actual construction of a mine. The change in the position of the accumulated water in the goaf in relation to the driving face may result in difference in the transient electromagnetic response characteristics. Therefore, the on-site arrangement of the instruments should also be correspondingly changed and it is necessary to adopt some targeted measures, otherwise it is difficult to obtain desirable detection results. However, the on-site debugging of the specific layout is labor- and time-consuming and fails to ensure an accurate correction result. Therefore, it is necessary to carry out simulation experiments in the laboratory before the actual detection. Several models are established for the detection of different types of positions of the accumulated water in the goaf relative to the driving face, and the detection scheme is corrected and optimized according to the results. The optimized scheme is then used in the actual detection of the site. The detection in such sequence is more scientific and reasonable, and this optimization method involves low cost and high efficiency, and can provide a more flexible guidance for the on-site detection.

Therefore, it is of great significance to develop a physical simulation test method for detecting a position of a ponding goaf in the excavation.

SUMMARY

From a perspective of designing a model test to enable the preliminary simulation judgment, the application provides a physical simulation test method for detecting a position of a ponding goaf in the excavation to overcome the defects in the prior art, including the lack of necessary optimization and correction and the lack of prediction and precision correction for the applicability of the specific working condition before the detection.

Technical solutions of this application are described below.

This application discloses a physical simulation test method for detecting a position of a ponding goaf in the excavation, comprising:

(1) establishing an experimental model of a structure similar to a stratum structure of a tunnel;

wherein the experimental model comprises a model A, a model B, a model C and a model D; the models A, B, C and D are the same in profile, structure and size, and each comprise a simulated geological formation comprising a rock formation C, a coal bed B, a rock formation B, a coal bed A and a rock formation A from bottom to top; a ponding goaf is provided in the simulated geological formation and positions of the ponding goaf in the models A, B, C and D are different from each other; a top of the ponding goaf is pre-buried with a water injection pipe; and a plurality of excavating tunnels in different positions and directions are respectively reserved in the models A, B, C and D;

(2) fabricating an induction coil; wherein the induction coil comprises a transmitting coil and a receiving coil for transient electromagnetism; the transmitting coil and the receiving coil are both square and the receiving coil is provided inside the transmitting coil; the transmitting coil is fabricated from an enameled wire with a nominal diameter of 0.450 mm and processed into 60 mm×60 mm×40 turns, and the receiving coil is fabricated from an enameled wire with a nominal diameter of 0.130 mm and processed into 58 mm×58 mm×80 turns; and the induction coil performs detection in a direction perpendicular to a plane of the induction coil;

(3) connecting the induction coil to a transient electromagnetometer and then placing them in the excavating tunnel in the model A, wherein the induction coil performs detection in a direction obliquely above the excavating tunnel and forming an angle of 45° with a bottom plate of the excavating tunnel; injecting water into the ponding goaf through the pre-buried water injection pipe; after the ponding goaf is filled with water, immediately switching the transient electromagnetometer on to collect data;

(4) after the data collection of the model A is completed, switching off the power and transferring the induction coil to the excavating tunnel in the model B, wherein the induction coil performs detection in a direction perpendicular to a driving direction of the excavating tunnel; injecting water into the ponding goaf through the pre-buried water injection pipe; after the ponding goaf is filled with water, immediately switching the transient electromagnetometer on to collect data;

(5) after the data collection of the model B is completed, switching off the power and transferring the induction coil to the excavating tunnel in the model C, wherein the induction coil performs detection in a direction laterally above the excavating tunnel and forming an angle of 45° with a bottom plate of the excavating tunnel; injecting water into the ponding goaf through the pre-buried water injection pipe; after the ponding goaf is filled with water, immediately switching the transient electromagnetometer on to collect data;

(6) after the data collection of the model C is completed, switching off the power and transferring the induction coil to the excavating tunnel in the model D, wherein the induction coil performs detection in a direction parallel to a driving direction of the excavating tunnel; injecting water into the ponding goaf through the pre-buried water injection pipe; after the ponding goaf is filled with water, immediately switching the transient electromagnetometer on to collect data; and (7) after the data collection of the model D is completed, statistically analyzing detection and imaging results of the four models; and positioning the ponding goaf in respective models according to the imaging results followed by comparison with data of the actual position of the ponding goaf in respective models to determine a detection accuracy and a correction coefficient, thereby providing references for the on-site detection of a position of a ponding goaf.

The simulated geological formation is prepared from fine sand with a particle size of 0.7-1.5 mm as an aggregate, and lime, gypsum and water as cementitious materials; the fine sand, lime, gypsum and water are mixed, stirred uniformly, laid into a mold and pressed, wherein a weight ratio of the fine sand to the lime to the gypsum to the water in a material used for the rock formations A, B and C is 7:0.6:0.4:1 and a weight ratio of the fine sand to the lime to the gypsum to the water in a material used for the coal beds A and B is 8:0.6:0.4:1; and a thicknesses of the rock formation C is 300 mm; a thickness of the coal bed B is 150 mm; a thickness of the rock formation B is 100 mm; a thickness of the coal bed A is 150 mm; and a thickness of the rock formation A is 300 mm.

The models A, B, C and D are all cubes of 1 $m^3$; the excavating tunnel is provided in the coal bed B and a cross section of the excavating tunnel is a combination of an arch and a rectangle; a height of the arch of the excavating tunnel and a height of the rectangle is 60-100 mm; and a width of the excavating tunnel is 60-100 mm and a length of a working surface is 200-400 mm.

The ponding goaf is a truncated square pyramid having an upper surface of 50 mm×50 mm, a bottom surface of 100 mm×100 mm and a height of 100-150 mm; the ponding goaf in the model A is located above a position which is in front of the excavating tunnel and a distance between the position and the excavating tunnel is 100 mm; the ponding goaf in the model B is in front of the excavating tunnel and a distance between them is 100 mm; the ponding goaf in the model C is located above a position which is in a lateral direction with respect to the excavating tunnel and a distance between the position and the excavating tunnel is 100 mm; and the ponding goaf in the model D is located in a lateral direction with respect to the excavating tunnel and a distance between them is 100 mm.

The models A, B, C and D are fabricated using a hollow cube steel plate enclosing structure without a top cover and a bottom cover as a template; after the fabrication is completed and a desired design strength is achieved, the hollow cube steel plate enclosing structure is removed so that the ponding goaf can be detected.

Compared to the prior art, this application has the following beneficial effects.

This application ensures that the detection of the position of the ponding goaf in the tunnel excavation can be carried out in a laboratory, facilitating the correction and optimization of the layout scheme in the case that the ponding goaf has different relative positions to the driving working surface. The simulation results acquired in the laboratory can provide technical guidance for the on-site detection. This application lowers the cost of optimizing the actual detection and overcomes the blindness in the geophysical construction to a certain extent, effectively improving the scientificity and rationality of detecting the position of the ponding goaf in the excavation and providing an important reference for the optimization of the geophysical method.

In the drawings, 1.1—model A; 1.2—model B; 1.3—model C; 1.4—model D; 2—excavating tunnel; 3—ponding goaf; 4—induction coil; 4.1—transmitting coil; 4.2—receiving coil; 5—water injection pipe; 6—rock formation A; 7—coal bed A; 8—rock formation B; 9—coal bed B and 10—rock formation C.

DETAILED DESCRIPTION OF EMBODIMENTS

The application will be further illustrated with reference to FIGS. 1-9.

This application discloses a hysical simulation test method for detecting a position of a ponding goaf in the excavation, which is described as follows.

(1) An experimental model of a structure similar to a stratum structure of a tunnel was established. The experimental model included a model A (1.1), a model B (1.2), a model C (1.3) and a model D (1.4), where the model A (1.1), the model B (1.2), the model C (1.3) and the model D (1.4) were the same in profile, structure and size, and each included a simulated geological formation including a rock formation C (10), a coal bed B (9), a rock formation B (8), a coal bed A (7) and a rock formation A (6) from bottom to top. A ponding goaf (3) was provided in the simulated geological formation and positions of the ponding goaf (3) in the model A (1.1), the model B (1.2), the model C (1.3) and the model D (1.4) were different from each other. A top of the ponding goaf was pre-buried with a water injection pipe (5) and a plurality of excavating tunnels (2) in different positions and directions are respectively reserved in the four models.

Figure 9:
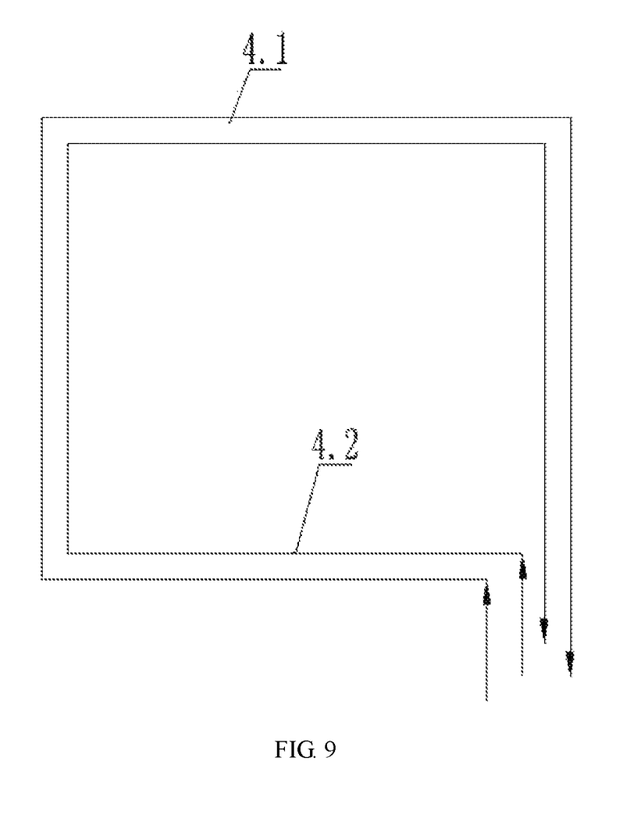
FIG. 9 schematically shows a structure of a detecting coil of the invention.

(2) An induction coil (4) was fabricated, where the induction coil (4) included a transmitting coil (4.1) and a receiving coil (4.2) for transient electromagnetism. The transmitting coil (4.1) and the receiving coil (4.2) were both square and the receiving coil (4.2) was provided inside the transmitting coil (4.1). The transmitting coil (4.1) was fabricated from an enameled wire with a nominal diameter of 0.450 mm and processed into 60 mm×60 mm×40 turns, and the receiving coil (4.2) was fabricated from an enameled wire with a nominal diameter of 0.130 mm and processed into 58 mm×58 mm×80 turns. The induction coil (4) performed detection in a direction perpendicular to a plane of the induction coil (4).

Figure 1:
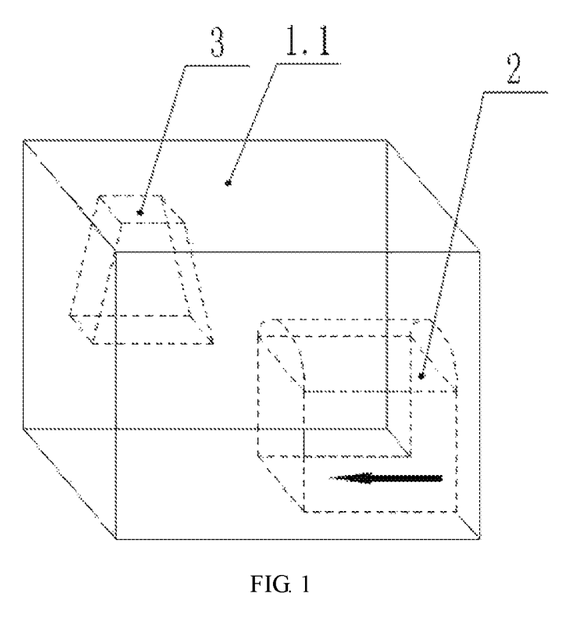
FIG. 1 shows a model A established in an experiment of the invention.
Figure 2:
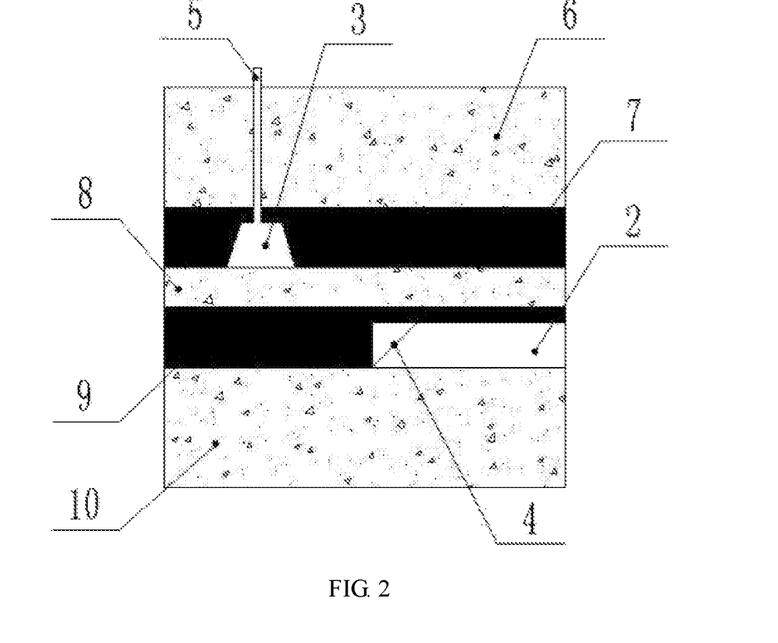
FIG. 2 schematically shows a detection structure for the ponding goaf in the model A in FIG. 1.
Figure 3:
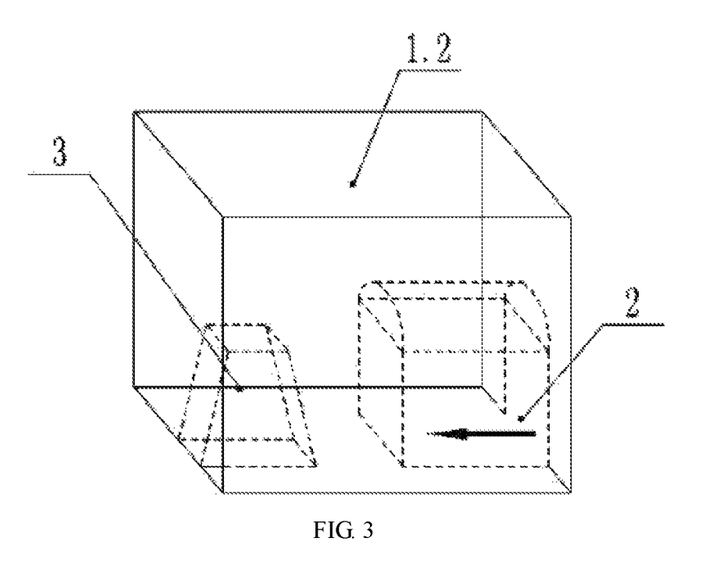
FIG. 3 shows a model B established in an experiment of the invention.

(3) The induction coil (4) was connected to a transient electromagnetometer and then placed in the excavating tunnel (2) in the model A (1.1), where the induction coil (4) performed detection in a direction obliquely above the excavating tunnel (2) and forming an angle of 45° with a bottom plate of the excavating tunnel (2). Water was injected into the ponding goaf (3) through the pre-buried water injection pipe (5). After the ponding goaf (3) was filled with water, the transient electromagnetometer was immediately switched on to collect data.

Figure 4:
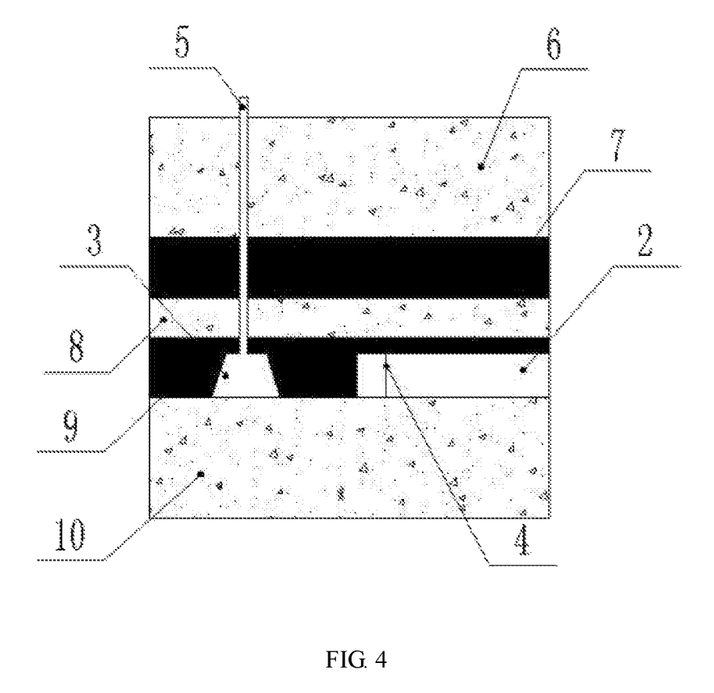
FIG. 4 schematically shows a detection structure for the ponding goaf in the model B in FIG. 3.
Figure 5:
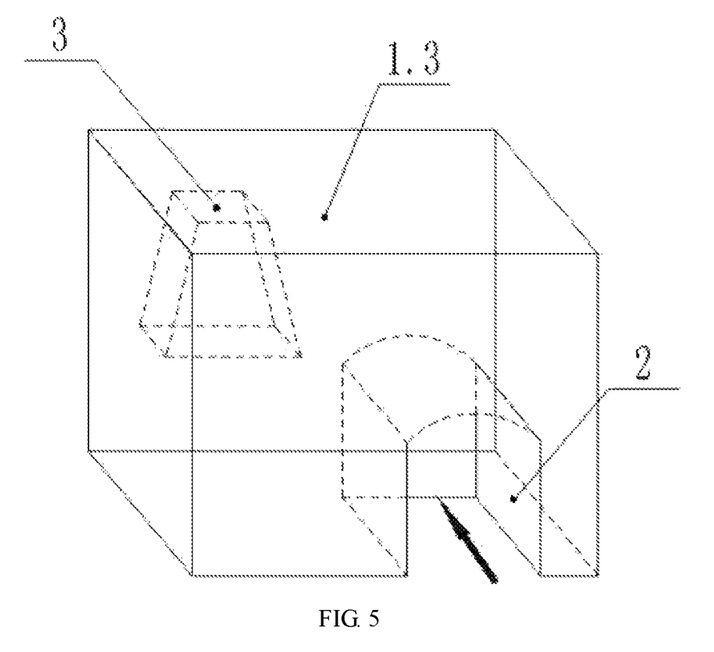
FIG. 5 shows a model C established in an experiment of the invention.

(4) After the data collection of the model A (1.1) was completed, the power was switched off and the induction coil (4) was transferred to the excavating tunnel (2) in the model B (1.2). The induction coil (4) performed detection in a direction perpendicular to a driving direction of the excavating tunnel (2). Water was injected into the ponding goaf (3) through the pre-buried water injection pipe (5). After the ponding goaf (3) was filled with water, the transient electromagnetometer was immediately switched on to collect data.

Figure 6:
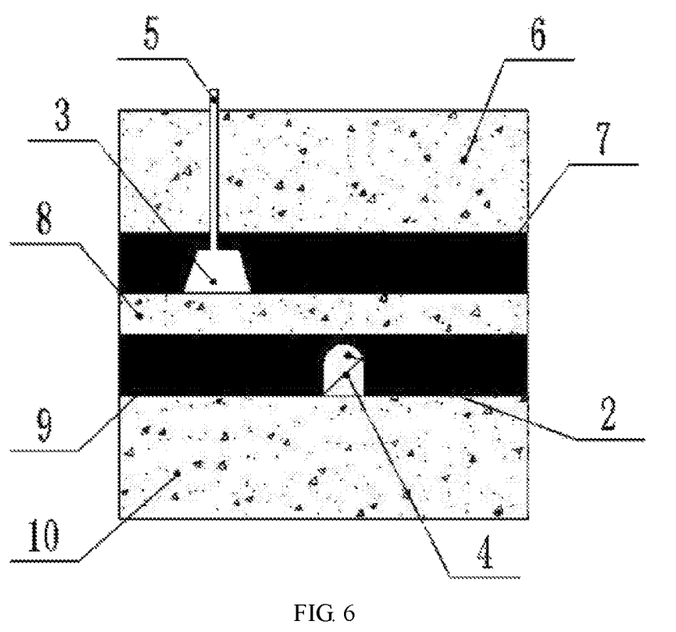
FIG. 6 schematically shows a detection structure for the ponding goaf in the model C in FIG. 5.
Figure 7:
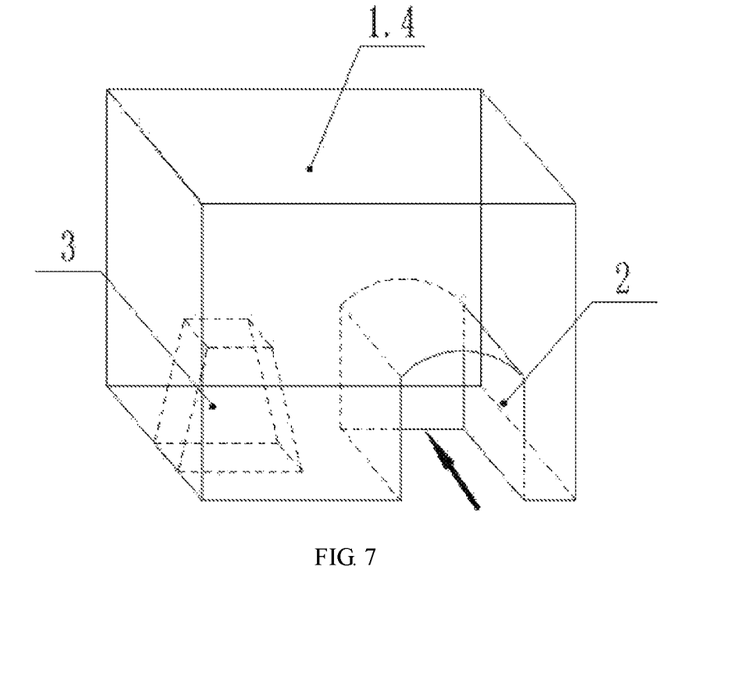
FIG. 7 shows a model D established in an experiment of the invention.

(5) After the data collection of the model B (1.2) was completed, the power was switched off and the induction coil (4) was transferred to the excavating tunnel (2) in the model C (1.3). The induction coil (4) performed detection in a direction laterally above the excavating tunnel and forming an angle of 45° with a bottom plate of the excavating tunnel (3). Water was injected into the ponding goaf (3) through the pre-buried water injection pipe (5). After the ponding goaf (3) was filled with water, the transient electromagnetometer was immediately switched on to collect data.

Figure 8:
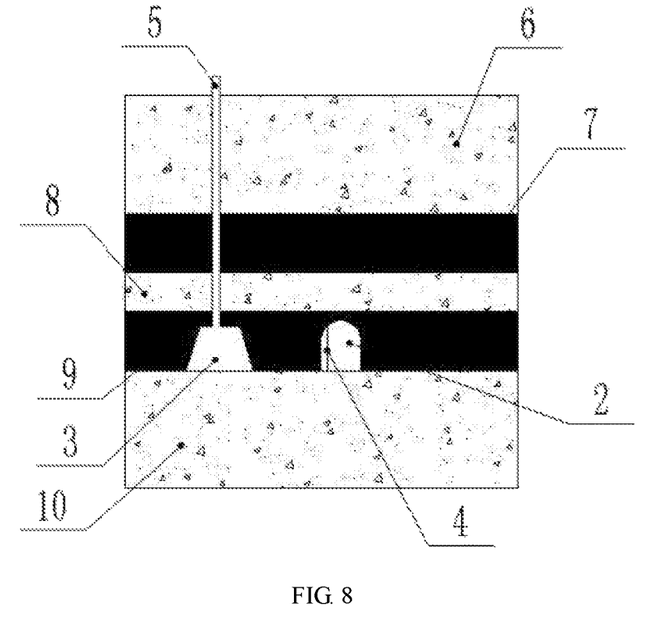
FIG. 8 schematically shows a detection structure for the ponding goaf in the model D in FIG. 7.

(6) After the data collection of the model C (1.3) was completed, the power was switched off and the induction coil (4) was transferred to the excavating tunnel (2) in the model D (1.4). The induction coil (4) performed detection in a direction parallel to a driving direction of the excavating tunnel (2). Water was injected into the ponding goaf (3) through the pre-buried water injection pipe (5). After the ponding goaf (3) was filled with water, the transient electromagnetometer was immediately switched on to collect data.

(7) After the data collection of the model D (1.4) was completed, the detection and imaging results of the four models were statistically analyzed. The ponding goaf (3) in respective models was positioned according to the imaging results, and the positioning results were compared with data of the actual position to determine the detection accuracy and the correction coefficient, thereby providing references for the on-site detection of the position of the ponding goaf (3).

The simulated geological formation was prepared from fine sand with a particle size of 0.7-1.5 mm as an aggregate, and lime, gypsum and water as cementitious materials. The fine sand, lime, gypsum and water were mixed, stirred uniformly, laid into a mold and pressed, where a weight ratio of the fine sand to the lime to the gypsum to the water in a material used for the rock formation A (6), the rock formation B (8) and the rock formation C (10) was 7:0.6:0.4:1 and a weight ratio of the fine sand to the lime to the gypsum to the water in a material used for the coal bed A (7) and the coal bed B (9) was 8:0.6:0.4:1. A thickness of the rock formation C (10) was 300 mm; a thickness of the coal bed B (9) was 150 mm; a thickness of the rock formation B (8) was 100 mm; a thickness of the coal bed A (7) was 150 mm; and a thickness of the rock formation A (6) was 300 mm.

The model A (1.1), the model B (1.2), the model C (1.3) and the model D (1.4) all were cubes of 1 m³. The excavating tunnel (2) was provided in the coal bed B (9) and a cross section of the excavating tunnel (2) was a combination of an arch and a rectangle. A height of the arch of the excavating tunnel (2) and a height of the rectangle was 60-100 mm. A width of the excavating tunnel (2) was 60-100 mm and a length of the working surface was 200-400 mm.

The ponding goaf (3) was a truncated square pyramid having an upper surface of 50 mm×50 mm, a bottom surface of 100 mm×100 mm and a height of 100-150 mm. The ponding goaf (3) in the model A (1.1) was located above a position which was in front of the excavating tunnel (2) and a distance between the position and the excavating tunnel (2) was 100 mm. The ponding goaf (3) in the model B (1.2) was in front of the excavating tunnel (2) and a distance between them was 100 mm. The ponding goaf (3) in the model C (1.3) was located above a position which was in a lateral direction with respect to the excavating tunnel (2) and a distance between the position and the excavating tunnel (2) was 100 mm. The ponding goaf (3) in the model D (1.4) was located in a lateral direction with respect to the excavating tunnel (2) and a distance between them was 100 mm. The model A (1.1), the model B (1.2), the model C (1.3) and the model D (1.4) were fabricated using a hollow cube steel plate enclosing structure without a top cover and a bottom cover as a template. After the fabrication was completed and a desired design strength was achieved, the hollow cube steel plate enclosing structure was removed so that the ponding goaf (3) can be detected.

A physical simulation test method for detecting a position of a ponding goaf in the excavation of the application included the following steps: establishing an experimental model with reference to the common water inrush cases; selecting the turn number and the size of a detecting coil based on the size of the model and selecting an appropriate transient electromagnetometer; detecting the respective models using a transient electromagnetic method to obtain the characteristics of transient electromagnetic response in various cases; and analyzing the deviation between the actual position of the ponding goaf and the position detected by the instrument to calculate the detection accuracy and the correction coefficient.

In an embodiment, the transient electromagnetometer was a TERRATEM transient electromagnetometer. Apparent resistivity imaging results of the detection of the four models were obtained and statistically analyzed in steps 4-7, and it was not difficult to find that the apparent resistivity value was mainly located in a range of 5-20 Ω·m. The area defined by the 6 Ω·m contour line was the low resistance anomaly area.

Further, according to the above results, the length and width of the low resistance anomaly area of the model A (1.1) were determined to be 55 mm and 56 mm, respectively; the length and width of the low resistance anomaly area of the model B (1.2) were determined to be 57 mm and 55 mm; the length and width of the low resistance anomaly area of the model C (1.3) were determined to be 56 mm and 55 mm;

and the length and width of the low resistance anomaly area of the model D (1.4) were determined to be 57 mm and 55 mm.

Further, by comparing the obtained results with the area of the normal cross section of the actual ponding goaf (3) in the model (length: 50 mm; width: 50 mm), it can be seen that the area of the region detected by the application was about 1.2 times that of the actual region. The correction coefficient of the detection was finally determined to be 0.8, that was, the error resulted in the detection can be corrected by multiplying the area of the detected region by the correction coefficient of 0.8, greatly improving the accuracy in positioning the ponding goaf (3).

What is claimed is:

1. A physical simulation test method for detecting a position of a ponding goaf in excavation, comprising:
   (1) establishing an experimental model of a structure similar to a stratum structure of a tunnel;
   wherein the experimental model comprises a model A, a model B, a model C and a model D; the models A, B, C and D are the same in profile, structure and size, and each comprise a simulated geological formation comprising a rock formation C, a coal bed B, a rock formation B, a coal bed A and a rock formation A from bottom to top; a ponding goaf is provided in the simulated geological formation and positions of the ponding goaf in the models A, B, C and D are different from each other; a top of the ponding goaf is pre-buried with a water injection pipe; and a plurality of excavating tunnels in different positions and directions are respectively reserved in the models A, B, C and D;
   (2) fabricating an induction coil, wherein the induction coil comprises a transmitting coil and a receiving coil for transient electromagnetism; the transmitting coil and the receiving coil are both square and the receiving coil is provided inside the transmitting coil; the transmitting coil is fabricated from an enameled wire with a nominal diameter of 0.450 mm and processed into 60 mm×60 mm×40 turns, and the receiving coil is fabricated from an enameled wire with a nominal diameter of 0.130 mm and processed into 58 mm×58 mm×80 turns; and the induction coil performs detection in a direction perpendicular to a plane of the induction coil;
   (3) connecting the induction coil to a transient electromagnetometer and then placing them in the excavating tunnel in the model A, wherein the induction coil performs detection in a direction obliquely above the excavating tunnel and forming an angle of 45° with a bottom plate of the excavating tunnel; injecting water into the ponding goaf through the pre-buried water injection pipe; after the ponding goaf is filled with water, immediately switching the transient electromagnetometer on to collect data;
   (4) after the data collection of the model A is completed, switching off the power and transferring the induction coil to the excavating tunnel in the model B, wherein the induction coil performs detection in a direction perpendicular to a driving direction of the excavating tunnel; injecting water into the ponding goaf through the pre-buried water injection pipe; after the ponding goaf is filled with water, immediately switching the transient electromagnetometer on to collect data;
   (5) after the data collection of the model B is completed, switching off the power and transferring the induction coil to the excavating tunnel in the model C, wherein the induction coil performs detection in a direction laterally above the excavating tunnel and forming an angle of 45° with a bottom plate of the excavating tunnel;
   injecting water into the ponding goaf through the pre-buried water injection pipe; after the ponding goaf is filled with water, immediately switching the transient electromagnetometer on to collect data;
   (6) after the data collection of the model C is completed, switching off the power and transferring the induction coil to the excavating tunnel in the model D, wherein the induction coil performs detection in a direction parallel to a driving direction of the excavating tunnel; injecting water into the ponding goaf through the pre-buried water injection pipe; after the ponding goaf is filled with water, immediately switching the transient electromagnetometer on to collect data; and
   (7) after the data collection of the model D is completed, statistically analyzing detection and imaging results of the four models; and positioning the ponding goaf in respective models according to the imaging results followed by comparison with data of the actual position of the ponding goaf in respective models to determine a detection accuracy and a correction coefficient, thereby providing references for the on-site detection of the position of the ponding goaf.

2. The physical simulation test method of claim 1, wherein the simulated geological formation is prepared from fine sand with a particle size of 0.7-1.5 mm as an aggregate, and lime, gypsum and water as cementitious materials; the fine sand, lime, gypsum and water are mixed, stirred uniformly, laid into a mold and pressed, wherein a weight ratio of the fine sand to the lime to the gypsum to water in a material used for the rock formations A, B and C is 7:0.6:0.4:1 and a weight ratio of the fine sand to the lime to the gypsum to water in a material used for the coal beds A and B is 8:0.6:0.4:1; and a thicknesses of the rock formation C is 300 mm; a thickness of the coal bed B is 150 mm; a thickness of the rock formation B is 100 mm; a thickness of the coal bed A is 150 mm; and a thickness of the rock formation A is 300 mm.

3. The physical simulation test method of claim 2, wherein the models A, B, C and D are all cubes of 1 m³; the excavating tunnel is provided in the coal bed B and a cross section of the excavating tunnel is a combination of an arch and a rectangle; a height of the arch of the excavating tunnel and a height of the rectangle is 60-100 mm; and a width of the excavating tunnel is 60-100 mm, and a length of a working surface is 200-400 mm.

4. The physical simulation test method of claim 3, wherein the models A, B, C and D are fabricated using a hollow cube steel plate enclosing structure without a top cover and a bottom cover as a template; after the fabrication is completed and a desired design strength is achieved, the hollow cube steel plate enclosing structure is removed so that the ponding goaf can be detected.

5. The physical simulation test method of claim 1, wherein the ponding goaf is a truncated square pyramid having an upper surface of 50 mm×50 mm, a bottom surface of 100 mm×100 mm and a height of 100-150 mm; the ponding goaf in the model A is located above a position which is in front of the excavating tunnel and a distance between the position and the excavating tunnel is 100 mm; the ponding goaf in the model B is in front of the excavating tunnel and a distance between them is 100 mm; the ponding goaf in the model C is located above a position which is in a lateral direction with respect to the excavating tunnel and a distance between the position and the excavating tunnel is 100 mm; and the ponding goaf in the model D is located in a lateral direction with respect to the excavating tunnel and a distance between them is 100 mm.

\* \* \* \* \*